United States Patent
Feldman et al.

[11] 4,037,969
[45] July 26, 1977

[54] ZONE PLATE ALIGNMENT MARKS

[75] Inventors: Martin Feldman, Murray Hill; Alan David White, Berkeley Heights, both of N.J.

[73] Assignee: Bell Telephone Laboratories, Incorporated, Murray Hill, N.J.

[21] Appl. No.: 673,126

[22] Filed: Apr. 2, 1976

[51] Int. Cl.² ............................................. G01B 11/26
[52] U.S. Cl. .............................. 356/172; 250/237 G; 350/162 ZP
[58] Field of Search ............. 250/237 G; 350/162 ZP; 356/172

[56] References Cited
U.S. PATENT DOCUMENTS

| | | | |
|---|---|---|---|
| 3,545,854 | 12/1970 | Olsson | 350/162 ZP |
| 3,689,162 | 9/1972 | Ferguson | 356/172 |
| 3,690,881 | 9/1972 | King | 96/27 |
| 3,915,576 | 10/1975 | Taylor | 356/172 |

*Primary Examiner*—John K. Corbin
*Assistant Examiner*—R. A. Rosenberger
*Attorney, Agent, or Firm*—Lucian C. Canepa

[57] ABSTRACT

Certain classes of patterns, for example so-called zone plates, are utilized as alignment marks in the fabrication of integrated circuits. Such a plate, which functions as a lens, provides a high-brightness image that is relatively insensitive to any degradation of the pattern.

12 Claims, 4 Drawing Figures

ZONE PLATE ALIGNMENT MARKS

BACKGROUND OF THE INVENTION

This invention relates to alignment marks and, more particularly, to the utilization of such marks in the fabrication of integrated circuits.

The fabrication of microminiature devices and circuits often requires that each of a set of masks (sometimes as many as 10 to 12) be successively aligned with high precision with respect to a semiconductor wafer. To obtain reasonable yields in the manufacture of very-high-resolution devices, sub-micron alignment tolerances are often required. Such tolerances are difficult to obtain by conventional manual means.

Automatic systems for achieving high-precision alignment of masks and wafers have been proposed. But designing these systems presents some formidable problems that arise, for example, from the fact that contrast and light levels from conventional alignment marks on typical wafers tend to be very low. Also, automatic systems as heretofore proposed may respond to small defects in the alignment patterns to give false indications. Hence these systems typically require the use of complex alignment patterns and extensive logic circuitry that in combination are designed to maximize the capability of the system to detect a true alignment-mark signal. Even when they function reliably, such systems tend in general to be relatively slow in operation.

Accordingly, the need arose in the process of fabricating integrated circuits for an alignment mark that would be characterized by high brightness, good contrast and relative freedom from degradation. It was recognized that such a mark if available would be an attractive basis for the design of an automatic alignment system.

SUMMARY OF THE INVENTION

Accordingly, an object of the present invention is an improved alignment mark particularly applicable to the fabrication of integrated circuits.

Briefly, this and other objects of the present invention are realized in a specific illustrative embodiment thereof in which a configuration such as a circular zone plate pattern is utilized as an alignment mark. Such a pattern functions as a lens and is capable of providing a high-brightness image even if the pattern should be degraded by, for example, abrasion or dust.

Such alignment patterns may be formed on a wafer and on each of an associated set of masks to be used in successively defining circuit features on the wafer. In that way the task of fabricating a high-resolution integrated circuit on the wafer is greatly facilitated.

Or such alignment patterns formed on a wafer enable precise positioning of the wafer at a series of predetermined locations. Such positioning is required, for example, in a step-and-repeat printer of the type used to successively project a reduced-size circuit pattern onto respective precisely specified areas of the wafer surface.

BRIEF DESCRIPTION OF THE DRAWING

A complete understanding of the present invention and of the above and other objects, features and advantages thereof may be gained from a consideration of the following detailed description presented hereinbelow in connection with the accompanying drawing, in which.

DETAILED DESCRIPTION

Figure 1:
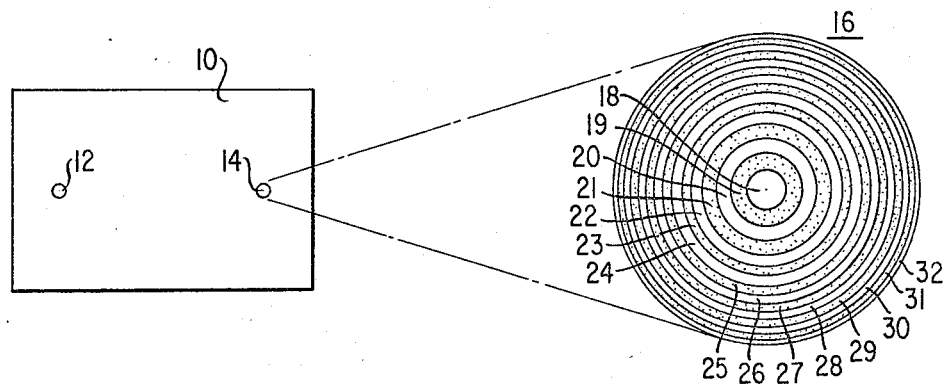
FIGS. 1 and 2 show specific illustrative alignment patterns made on a wafer and mask, respectively, in accordance with one aspect of the principles of the present invention.

FIG. 1 is a top view of a mask 10 which comprises, for example, a glass substrate having a selectively patterned film of chromium deposited thereon. Two specific illustrative alignment marks 12 and 14 made in accordance with the principles of the present invention are formed in spaced-apart surface portions of the mask 10. FIG. 1 also shows an enlargement 16 of the configuration of the mark 14. The enlarged mark 16 is diagrammatically represented as comprising an inner circle 18 surrounded by a set of concentric rings 19 through 32. The remainder of the surface of the mask 10 is patterned in a conventional manner (not shown in the drawing) to represent features of an integrated circuit to be formed in an associated semiconductor wafer.

The inner circle 18 and the rings 20, 22, 24, 26, 28, 30 and 32 of the mark 16 of FIG. 1 comprise, for example, regions of relatively high reflectivity, whereas the rings 19, 21, 23, 25, 27, 29 and 31 are designed to exhibit relatively low reflectivity. In the specific illustrative example in which the mask 10 comprises a glass substrate having chromium patterns thereon, the areas 18, 20, 22, 24, 26, 28, 30 and 32 are made of chromium and the areas 19, 21, 23, 25, 27, 29 and 31 comprise surface portions of the glass substrate. Alternatively, the areas 18, 20, 22, 24, 26, 28, 30, 32 and 19, 21, 23, 25, 27, 29, 31 may be formed to be regions of relatively low and high reflectivity, respectively. Either described arrangement is effective to function in the particular manner to be described later below.

The mark 16 shown in FIG. 1 may be formed in a number of conventional ways. For example, an enlarged version of the mark 16 may initially be made by means of a laser reticle generator of the type disclosed in U.S. Pat. No. 3,943,529, issued Mar. 9, 1976 to M. Feldman and J. M. Moran. Reduction and transfer of such a reticle pattern to the mask 10 to form the marks 12 and 14 are straightforward and well understood by workers in the field of photolithography. Alternatively, the marks 12 and 14 may be formed directly in the top surface of the mask 10 by known techniques of electron lithography utilizing, for example, an electron beam exposure system of the type described in U.S. Pat. No. 3,900,737, issued Aug. 19, 1975 to R. J. Collier and D. R. Herriott.

By way of example, the specific illustrative marks 12 and 14 shown in FIG. 1 comprise circular Fresnel zone plates. A circular zone plate is defined by a set of concentric circles whose radii are proportional to the square roots of whole numbers. More specifically, the radius $s_m$ of the $m^{th}$ half wave zone of a circular Fresnel zone plate is related to the source distance $a$ and the image distance $b$ by $$\frac{m\lambda}{2} = \frac{s_m^2}{2}\left(\frac{1}{a} + \frac{1}{b}\right) \quad m \text{ integer} \tag{1}$$

where $\lambda$ is the wavelength of the light that is directed at the plate. Writing equation 1 in the form $$\frac{1}{a} + \frac{1}{b} = \frac{m\lambda}{s_m^2} \equiv \frac{1}{f} \qquad (2)$$

it is evident that in the paraxial limit such a plate functions in effect as a lens with a focal length $$f \equiv \frac{s_m^2}{m\lambda} = \frac{s_1^2}{1\lambda}.$$

Thus, for a monochromatic beam of known wavelength incident on such a plate, a desired focal length may be established simply by selecting the radius of the innermost circle (for example, the circle 18 in FIG. 1) to satisfy the expression for $f$ given above. And the radii $s_2$, $s_3 \ldots s_m$ of the other successively numbered and larger circles included in the pattern 16 of FIG. 1 are established by the relationship $s_m \sim \sqrt{m}\, s_1$.

In one specific illustrative embodiment of the principles of the present invention, the alignment mark 16 included on the mask 10 of FIG. 1 comprises an inner circle 18 whose radius is 12.58 microns. Illustratively, that embodiment includes 14 rings surrounding the circle 18. The radii of the successive concentric circles that define these rings are defined by the relation $s_m = \sqrt{m}\, s_1$, where m comprises successive integers and $s_1$ is the radius of circle 18 of FIG. 1. Such a pattern of alternating reflective and nonreflective rings responds to an incident focused beam of monochromatic light at a wavelength of 0.633 microns to produce a high-brightness spot of light approximately 3 microns in diameter at a distance of 500 microns above the surface of the mask 10. The source of such light may, for example, be a focused laser beam. Alternatively, a mercury arc lamp or a polychromatic source with an associated filter may be used to provide the incident monochromatic radiation.

In standard alignment systems, using conventional alignment patterns, very-low-brightness and/or low-contrast images are sometimes formed. Accurate processing of such images is time consuming and difficult. But, since in a system made in accordance with this invention, the alignment mark functions as a focusing lens to form the image spot, even marks characterized by low diffraction efficiencies are effective to provide images of relatively high-brightness and contrast. This advantage is particularly evident and significant when zone plate marks made in accordance with this invention are formed on semiconductor wafers.

Moreover, it is a characteristic of an alignment mark, such as the zone plate pattern 16 of FIG. 1, that minor degradation of the pattern does not significantly affect the size, intensity or position of the diffracted image formed by the pattern. Thus the pattern is relatively insensitive to dust particles or physical damage to the pattern. Despite such types of degradation the pattern is still able to provide an imaged spot effective for alignment purposes.

In fact, it has been determined that a usable focused spot can be obtained in a system made in accordance with the principles of the present invention even if entire parts of the alignment marks are degraded or omitted. Thus, for example, even if several of the inner rings of the particular pattern 16 of FIG. 1 are omitted, the remaining pattern if effective to provide an imaged spot for alignment purposes. In turn, as will be specified below, this important characteristic is the basis for specifying a unique set of inter-related mask and wafer alignment patterns.

Figure 2:
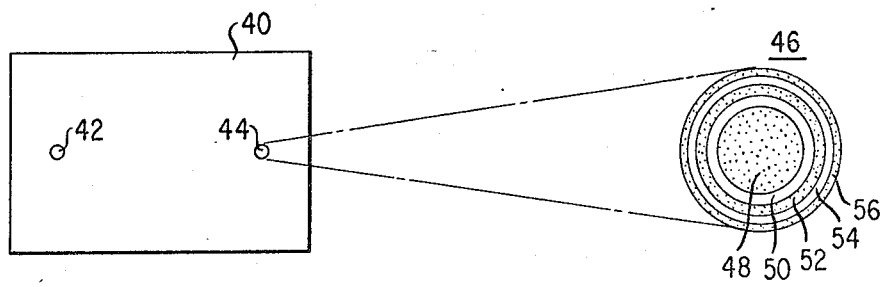

FIG. 2 is a top view of a semiconductor wafer 40. Two specific illustrative alignment marks 42 and 44 made in accordance with the principles of the present invention are formed in spaced-apart surface portions of the wafer 40. FIG. 2 also shows an enlargement 46 of the configuration of the mark 44. The enlarged mark 46 is diagrammatically represented as comprising an inner circle 48 surrounded by a set of concentric rings 50, 52, 54 and 56.

The inner circle 48 and the rings 50, 52, 54 and 56 comprise, for example, alternating regions of relatively low and high reflectivity. Such regions may be formed on the wafer 40 in a variety of ways known in the art. For example, the pattern 46 may first be established in a mask (not shown) and then transferred to the wafer 40 by conventional photolithographic techniques. Or the pattern 46 may be formed on the wafer 40 by direct processing with an electron beam exposure system.

Alternatively, the rings 50 and 54 of the mark 46 of FIG. 2 may be formed in the wafer 40 such that their top surfaces lie in a common plane that is higher or lower than the plane in which the major portion of the top surface of the wafer 40 lies. In that case the top surfaces of the areas 52 and 56 are established to lie in a different common plane that is higher or lower than the plane of the major portion of the top surface of the wafer 40. Such height gradations in an illuminated zone plate pattern give rise to phase differences that are effective to achieve the lens-like diffraction effect described above. Or various combinations of reflectivity and height gradations may be employed to achieve a focused spot in response to the impingement of monochromatic light on the pattern 46.

Advantageously, the radius of the inner circle 48 of the alignment mark 46 of FIG. 2 is selected to be approximately equal to the radius of the circle that defines the outer extremity of the ring 32 of the mark 16 of FIG. 1. Accordingly, when the mask 10 and the wafer 40 are being aligned, the mark 16 will overlie the circle 48. This is advantageous because preliminary visual alignment between the mask and wafer is thereby facilitated since the alignment mark 46 on the wafer 40 is not visually obscured by the mark 16 on the mask 10. Moreover, since the alignment mark 16 on the mask 10 does not overlie any portion of the ring configuration of the mark 46, no portion of the wafer alignment mark 46 is degraded when the mask 10 is flooded with light during the process of transferring the overall mask pattern onto a negative-resist-coated surface of the wafer 40. Accordingly, only a single set of alignment marks is needed on the wafer 40 to achieve registration between the wafer and each of successive associated masks. This is advantageous because it minimizes the surface area of the wafer that must be dedicated to alignment marks, which leaves more area available for forming integrated circuits.

It is noted that for the particular mask-wafer set of nested zone plate alignment marks specified above, the sizes of the respective image spots formed by the zone plates are different.

Figure 3:
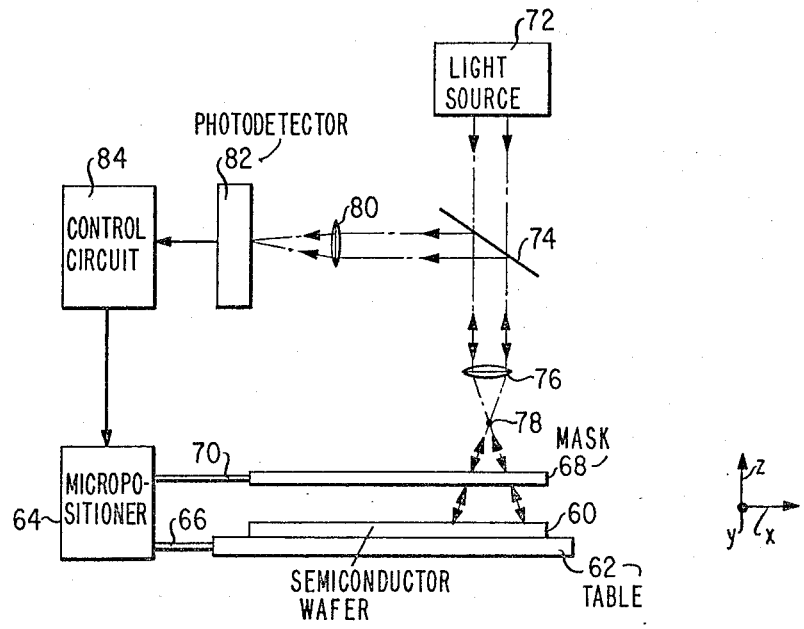
FIGS. 3 and 4 are schematic representations of two specific illustrative automatic alignment systems that embody aspects of the principles of this invention.

FIG. 3 represents an automatic alignment system made in accordance with the principles of the present invention. A semiconductor wafer 60 is mounted on a conventional x-y movable table 62. Movement of the table 62 is controlled by a standard micropositioner 64 which is mechanically connected by a coupler 66 to the table 62.

In FIG. 3 a mask 68 is shown spaced apart from the wafer 60. Precise movement of the mask in the z direction to establish a predetermined spacing between the wafer 60 and the mask 68 is controlled by the unit 64 via a mechanical coupler 70. In practice, this predetermined spacing approximates 5 to 100 microns.

With the mask 68 and the wafer 60 in the spacedapart position shown in FIG. 3, preliminary alignment therebetween is established by conventional means (for example, visual registration) that brings each associated pair of alignment marks on the mask and wafer into approximate registration. For precise alignment, monochromatic light from a source 72 is then directed through a conventional beam splitter 74 and a lens 76 to flood the surface portions of the mask and wafer which contain a matched set of the herein-described alignment marks. In practice, plural pairs of mask-wafer marks may have to be respectively aligned to achieve exact registration between the mask and wafer.

Light reflected from the alignment mark on the mask 68 of the FIG. 3 arrangement is focused by the aforedescribed lens-like action of the mark to form a bright image spot in the x-y plane that includes a point 78. By design, the focal length of the alignment mark on the wafer 60 is advantageously selected such that light reflected from the mark on the wafer 60 also forms a bright image spot in the x-y plane that includes the point 78. If desired, these spots may be visually observed by an operator by means of a microscope. (In that case the lens 76 constitutes a microscope objective.) Manual movement of the table 62 may then be carried out until the spots appear to the operator to be coincident. The mask 68 may then be manually moved in the z direction to position the mask and wafer for a conventional lithographic printing operation.

But, advantageously, in accordance with the principles of the present invention, the unique alignment marks described herein are the basis for constructing an automatic alignment system of the type shown in FIG. 3. In FIG. 3 the imaged spots formed by the respective alignment marks on the mask 68 and the wafer 60 are directed by the lens 76 and the beam splitter 74 to a lens 80 that forms images of the mark-generated spots on the surface of a conventional photodetector unit 82. The unit 82 may comprise, for example, a standard split-quadrant photodiode or a matrix array of photodiodes. In any case, the unit 82 is adapted in a manner known in the art to provide electrical output signals that are representative of the relative positions of the image spots derived from the alignment marks on the mark 68 and the wafer 60, respectively. These signals are applied to a standard control circuit 84 that supplies positioning signals to the micropositioner 64. In response to these signals the micropositioner moves the table 62 in the x and/or y directions to cause the spots that impinge on the photodetector unit 82 to be brought into exact overlapping registration. (Other strategies well known in the art may also be used. For example, proper alignment may be achieved with the two spots respectively formed by the wafer and mask zone plates not coincident in either x, y or z.) After the system achieves the desired mask-to-wafer alignment, the micropositioner 64 is controlled to move the mask 68 in the z direction to establish a predetermined z-direction distance for lithographically transferring the mask features onto the wafer 60.

Alignment of a semiconductor wafer in a predetermined position with respect to a reference location is often an important step in the fabrication of integrated circuits. In this step it is particularly important that the alignment technique used be characterized by high-speed, high-brightness and high-contrast images. Such positioning, which is required, for example, in a conventional step-and-repeat projection printer, may be carried out by the specific illustrative system shown in FIG. 4.

Figure 4:
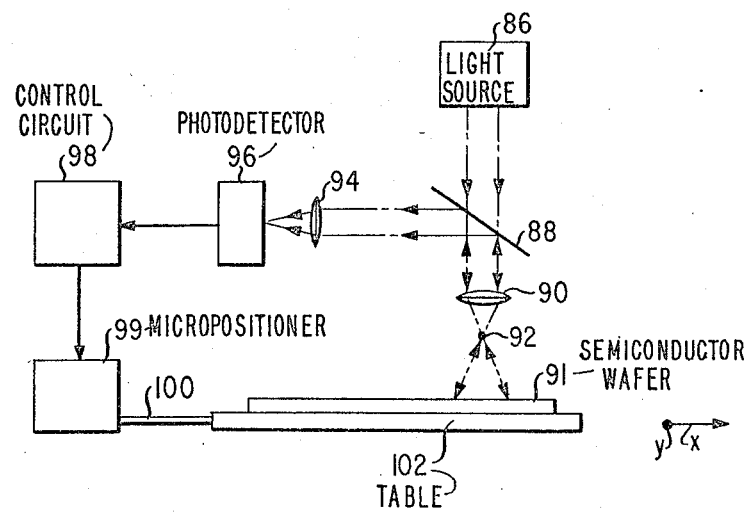

In FIG. 4, light from a source 86 is directed via a beam splitter 88 and a lens 90 to impinge upon a zone plate alignment mark of the type specified herein. Light reflected from the mark on wafer 91 forms a focused bright spot at point 92. In turn, light from the spot 92 is directed through the lens 90, the beam splitter 88 and lens 94 to form an image spot on the surface of a photodetector unit 96. Electrical signals applied to a control unit 98 from the unit 96 are processed to generate control signals representative of the deviation, if any, of the wafer 91 from a predetermined reference position. Any such deviation signals are applied to a micropositioner 99 which, via a mechanical coupler 100, moves table 102 to position the wafer 91 in a location to minimize the deviation.

Finally, it is to be understood that the various above-described arrangements are only illustrative of the application of the principles of the present invention. In accordance with these principles, numerous other arrangements may be devised by those skilled in the art without departing from the spirit and scope of the invention. For example, although emphasis herein has been to the use of monochromatic light during the alignment process, it is also feasible to employ unfiltered polychromatic radiation. In such a case the alignment mark on the wafer might be designed to form, for example, a blue spot in a reference plane and the alignment mark on the mask designed to form say a red spot in the same plane. Other spots would, of course, be formed by the respective marks in other planes. But the alignment marks can be designed to form these images in spaced-apart planes to which the alignment system is relatively insensitive.

In addition, it is emphasized that the particular circular zone plates specified above are illustrative only. In accordance with the principles of the present invention, a variety of known configurations may be formed on masks and/or wafers and utilized as lens-like alignment patterns. For example, so-called linear zone plates, which form focused line images, are also useful as alignment marks.

Moreover, it is to be understood that in some applications of practical interest alignment patterns other than zone plates may be utilized. Thus, for example, holograms (generated either by standard holographic techniques or by computer) may be formed on masks and/or wafers to produce the desired focused images for alignment purposes. These images may comprise configurations (for example crosses or squares) that are more complicated than the particular illustrative images specified above. In such cases the light that is directed at the holographic alignment patterns must be coherent in nature. Of course this requirement is easily met by utilizing a conventional laser source.

What is claimed is:

1. A mask member for use in fabricating microminiature devices, said member comprising a relatively transparent substrate having a selectively patterned relatively opaque layer disposed on said substrate, said selectively patterned layer having formed therein at least one alignment mark pattern, said alignment mark pattern, when illuminated by incident radiation, forming a focused image in a reference plane that is spaced apart a predetermined distance from said forming means.

2. A member as in claim 1 wherein said alignment mark pattern comprises a circular zone plate pattern which when illuminated by incident monochromatic radiation forms a focused spot in said reference plane.

3. A wafer member adapted to have formed on the surface thereof multiple microminiature devices, said member comprising a semiconductor substrate and an alignment mark pattern formed on the surface of said substrate, said pattern, when illuminated by incident radiation, forming a focused image in a reference plane that is spaced apart a predetermined distance from said forming means.

4. A member as in claim 3 wherein said alignment mark pattern comprises a circular zone plate pattern which when illuminated by incident monochromatic radiation forms a focused spot in said reference plane.

5. In the fabrication of integrated circuits, a method for aligning a semiconductor wafer, said method comprising the steps of
forming on a portion of the surface of said wafer a pattern that when illuminated by incident radiation forms a high-intensity focused image at a prescribed distance from said surface in a referenced plane,
directing radiation at said pattern,
and moving the surface of said wafer in a plane parallel to said reference plane until said image is detected to occur in a predetermined location in said reference plane.

6. A method as in claim 5 wherein said forming step comprises forming on said wafer a circular zone plate,
and wherein said directing step comprises directing a beam of monochromatic radiation at said zone plate thereby to form a high-intensity focused spot in said reference plane.

7. In the fabrication of integrated circuits, a method for aligning a mask member with respect to a semiconductor wafer, said method comprising the steps of
forming patterns on said mask and wafer that when illuminated by incident radiation form respective high-intensity focused images at prescribed distances from said mask and wafer in a reference plane,
directing radiation at said patterns,
and varying the relative positions of said mask and wafer until said images are detected to occur in a predetermined location in said reference plane.

8. A method as in claim 7 wherein said forming step comprises forming on each of said mask and wafer a circular zone plate pattern,
and wherein said directing step comprises directing a beam of monochromtic radiation at said zone plates thereby to form high-intensity focused spots in said reference plane.

9. Apparatus for aligning a semiconductor wafer of the type that includes on a surface portion of the wafer means that when illuminated by incident radiation forms a high-intensity focused image at a prescribed distance from said surface in a reference plane,
said apparatus comprising:
a movable table for carrying said wafer,
means for directing radiation at said forming means on said wafer thereby to form a high-intensity focused image in said reference plane,
and means responsive to the location of said image in said plane for applying control signals to said table to move said wafer to a predetermined position.

10. Apparatus as in claim 9 wherein said directing means comprises
a source of monochromatic radiation,
a beam splitter responsive to incident radiation from said source for directing a portion of said radiation toward said forming means,
and a lens interposed between said beam splitter and said forming means for focusing said incident radiation to a spot in said reference plane,
and wherein said applying means comprises
a photodetecting arrangement,
and a lens interposed between said beam splitter and said photodetecting arrangement in the path of radiation reflected from said forming means for focusing said reflected radiation onto said photodetecting arrangement.

11. Apparatus for aligning a mask member with respect to a semiconductor wafer, said mask member and said wafer including on a surface portion thereof means that when illuminated by incident radiation forms respective high-intensity focused images at prescribed distances from said mask and wafer in a reference plane,
said apparatus comprising
means for directing radiation at said forming means thereby to form focused images in said plane,
and means responsive to the relative locations of said images in said plane for varying the relative positions of said mask and wafer until said images are detected to occur in a predetermined location in said reference plane.

12. Apparatus as in claim 11 wherein said forming means comprises a circular zone plate on each of said mask and wafer
wherein said directing means comprises
a source of monochromatic radiation,
a beam splitter responsive to incident radiation from said source for directing a portion of said radiation toward said forming means,
and a lens interposed between said beam splitter and said forming means for focusing said incident radiation to a spot in said reference plane
and wherein said varying means comprises
a photodetecting arrangement,
a lens interposed between said beam splitter and said photodetecting arrangement in the path of radiation reflected from said forming means for focusing said reflected radiation onto said photodetecting arrangement,
and means responsive to signals generated by said photodetecting arrangement for mechanically controlling the relative positions of said mask and said wafer.

* * * * *